US009739846B2

(12) United States Patent
Petrie et al.

(10) Patent No.: US 9,739,846 B2
(45) Date of Patent: Aug. 22, 2017

(54) MAGNETIC FIELD SENSORS WITH SELF TEST

(71) Applicant: Allegro Microsystems, LLC, Worcester, MA (US)

(72) Inventors: Craig S. Petrie, Merrimack, NH (US); Bryan Cadugan, Bedford, NH (US); David Toebes, Andover, MA (US); Michael C. Doogue, Bedford, NH (US); William P. Taylor, Amherst, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 441 days.

(21) Appl. No.: 14/506,024

(22) Filed: Oct. 3, 2014

(65) Prior Publication Data

US 2016/0097825 A1   Apr. 7, 2016

(51) Int. Cl.
*G01R 33/07* (2006.01)
*G01R 33/09* (2006.01)
*G01D 5/14* (2006.01)
*G01D 18/00* (2006.01)

(52) U.S. Cl.
CPC ......... *G01R 33/072* (2013.01); *G01R 33/091* (2013.01); *G01D 5/145* (2013.01); *G01D 18/00* (2013.01)

(58) Field of Classification Search
CPC .... G01R 33/072; G01R 33/091; G01D 18/00; G01D 5/145
USPC .................... 324/207.2, 207.21, 207.25, 251
See application file for complete search history.

(56) References Cited

U.S. PATENT DOCUMENTS

| 4,236,832 A | 12/1980 | Komatsu et al. |
| 4,438,347 A | 3/1984 | Gehring |
| 4,752,733 A | 6/1988 | Petr et al. |
| 4,758,943 A | 7/1988 | Åström et al. |
| 4,760,285 A | 7/1988 | Nelson |
| 4,823,075 A | 4/1989 | Alley |
| 4,833,406 A | 5/1989 | Foster |
| 4,970,411 A | 11/1990 | Halg et al. |

(Continued)

FOREIGN PATENT DOCUMENTS

| DE | 38 29 815 A1 | 3/1990 |
| DE | 195 39 458 A1 | 4/1997 |

(Continued)

OTHER PUBLICATIONS

PCT Search Report and Written Opinion of the ISA dated Jan. 15, 2016 for PCT Pat. App. No. PCT/US2015/051315; 18 pages.

(Continued)

*Primary Examiner* — Jay Patidar
(74) *Attorney, Agent, or Firm* — Daly, Crowley, Mofford & Durkee, LLP (57) ABSTRACT

A system includes a magnetic target and a magnetic field sensor. The magnetic field sensor comprises an output node; a circuit to detect a magnetic field produced by the magnetic target; and a processor. The processor may be configured to transmit a signal onto the output node representing the detected magnetic field; detect whether the transmitted signal is interrupted by an external source; and, if the signal is interrupted, initiate a self-test of the apparatus. Corresponding methods and apparatuses are also disclosed.

31 Claims, 5 Drawing Sheets

(56) References Cited

U.S. PATENT DOCUMENTS

| | | | |
|---|---|---|---|
| 5,038,246 | A | 8/1991 | Durivage, III |
| 5,247,278 | A | 9/1993 | Pant et al. |
| 5,329,416 | A | 7/1994 | Ushiyama et al. |
| 5,412,255 | A | 5/1995 | Wallrafen |
| 5,424,558 | A | 6/1995 | Borden et al. |
| 5,469,058 | A | 11/1995 | Dunnam |
| 5,521,501 | A | 5/1996 | Dettmann et al. |
| 5,621,319 | A | 4/1997 | Bilotti et al. |
| 5,640,090 | A | 6/1997 | Furuya et al. |
| 6,011,770 | A | 1/2000 | Tan |
| 6,014,091 | A | 1/2000 | Noltemeyer et al. |
| 6,288,567 | B1 | 9/2001 | Fink |
| 6,351,506 | B1 | 2/2002 | Lewicki |
| 6,392,478 | B1 | 5/2002 | Mulder et al. |
| 6,436,748 | B1 | 8/2002 | Forbes et al. |
| 6,437,558 | B2 | 8/2002 | Li et al. |
| 6,896,407 | B2 | 5/2005 | Nomiyama et al. |
| 6,917,321 | B1 | 7/2005 | Haurie et al. |
| 6,968,484 | B2 | 11/2005 | Hummel |
| 7,038,448 | B2 | 5/2006 | Schott et al. |
| 7,190,784 | B2 | 3/2007 | Li |
| 7,259,545 | B2 | 8/2007 | Stauth et al. |
| 7,292,095 | B2 | 11/2007 | Burt et al. |
| 7,319,319 | B2 | 1/2008 | Jones et al. |
| 7,319,418 | B2 | 1/2008 | Fink |
| 7,323,870 | B2 | 1/2008 | Tatschl et al. |
| 7,325,175 | B2 | 1/2008 | Momtaz |
| 7,425,821 | B2 | 9/2008 | Monreal et al. |
| 7,474,093 | B2 | 1/2009 | Ausserlechner |
| 7,518,354 | B2 | 4/2009 | Stauth et al. |
| 7,605,647 | B1 | 10/2009 | Romero et al. |
| 7,635,993 | B2 | 12/2009 | Boeve |
| 7,694,200 | B2 | 4/2010 | Forrest et al. |
| 7,701,208 | B2 | 4/2010 | Nishikawa |
| 7,729,675 | B2 | 6/2010 | Krone |
| 7,746,056 | B2 | 6/2010 | Stauth et al. |
| 7,746,065 | B2 | 6/2010 | Pastre et al. |
| 7,764,118 | B2 | 7/2010 | Kusuda et al. |
| 7,769,110 | B2 | 8/2010 | Momtaz |
| 7,800,389 | B2 | 9/2010 | Friedrich et al. |
| 7,923,996 | B2 | 4/2011 | Doogue et al. |
| 7,936,144 | B2 | 5/2011 | Vig et al. |
| 7,961,823 | B2 | 6/2011 | Kolze et al. |
| 7,990,209 | B2 | 8/2011 | Romero |
| 8,030,918 | B2 | 10/2011 | Doogue et al. |
| 8,128,549 | B2 | 3/2012 | Testani et al. |
| 8,134,358 | B2 | 3/2012 | Charlier et al. |
| 8,577,634 | B2 | 11/2013 | Donovan et al. |
| 2002/0084923 | A1 | 7/2002 | Li |
| 2003/0038675 | A1 | 2/2003 | Gailus et al. |
| 2003/0102909 | A1 | 6/2003 | Motz |
| 2003/0164711 | A1 | 9/2003 | Ishida |
| 2004/0056647 | A1 | 3/2004 | Stauth et al. |
| 2005/0183489 | A1 | 8/2005 | Weinberg et al. |
| 2006/0152210 | A1 | 7/2006 | Mangtani et al. |
| 2006/0202692 | A1 | 9/2006 | Tatschl et al. |
| 2007/0110199 | A1 | 5/2007 | Momtaz et al. |
| 2007/0247141 | A1 | 10/2007 | Pastre et al. |
| 2007/0285089 | A1 | 12/2007 | Ibuki et al. |
| 2008/0094055 | A1 | 4/2008 | Monreal et al. |
| 2008/0137784 | A1 | 6/2008 | Krone |
| 2008/0238410 | A1 | 10/2008 | Charlier et al. |
| 2009/0001964 | A1 | 1/2009 | Strazalkowski |
| 2009/0001972 | A1 | 1/2009 | Fernandez et al. |
| 2009/0085706 | A1 | 4/2009 | Baarman et al. |
| 2009/0212765 | A1 | 8/2009 | Doogue et al. |
| 2009/0251134 | A1 | 10/2009 | Uenoyama |
| 2009/0278711 | A1 | 11/2009 | Lohberg et al. |
| 2010/0211347 | A1 | 8/2010 | Friedrich et al. |
| 2011/0018533 | A1 | 1/2011 | Cesaretti et al. |
| 2011/0048102 | A1 | 3/2011 | Fernandez et al. |
| 2011/0074016 | A1 | 3/2011 | Narita |
| 2011/0298448 | A1 | 12/2011 | Foletto et al. |
| 2012/0274314 | A1 | 11/2012 | Cesaretti et al. |
| 2012/0313635 | A1 | 12/2012 | Daubert |
| 2013/0335068 | A1* | 12/2013 | Dwyer ................ G01D 5/147 324/207.11 |
| 2013/0335069 | A1 | 12/2013 | Vig et al. |
| 2014/0184200 | A1 | 7/2014 | Milano et al. |

FOREIGN PATENT DOCUMENTS

| | | |
|---|---|---|
| DE | 10 2006 037 226 A1 | 2/2008 |
| DE | 10 2007 041 230 B3 | 4/2009 |
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 1637898 A1 | 3/2006 |
| EP | 1679524 A1 | 7/2006 |
| EP | 1850143 A1 | 10/2007 |
| EP | 2 211 147 A1 | 7/2010 |
| GB | 2276727 A | 10/1994 |
| WO | WO 9602849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/012006 A1 | 1/2009 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |

OTHER PUBLICATIONS

PCT International Preliminary Report on Patentability and Writing Opinion of the ISA dated Jul. 9, 2015; for PCT Pat. App. No. PCT/US2013/071648.

U.S. Appl. No. 13/730,100 Office Action dated Mar. 19, 2015, 33 pages.

SAE International Surface Vehicle Information Report SAE J2716; SENT-Single Edge Nibble Transmission for Automotive Applications; Jan. 2010; 56 pages.

Final Office Action dated Dec. 4, 2015; For U.S. Appl. No. 13/730,100; 14 pages.

Response filed Aug. 24, 2015; to Office Action dated Mar. 19, 2015; for U.S. Appl. No. 13/730,100; 16 pages.

U.S. Appl. No. 13/398,127, filed Jan. 16, 2012, Cessaretti et al.

U.S. Appl. No. 13/743,451, filed Jan. 17, 2013, Friedrich et al.

U.S. Appl. No. 14/337,613, filed Jul. 22, 2014, Scheller et al.

ACS710 "120 kHz Bandwidth, High Voltage Isolation Current Sensor with Integrated Overcurrent Detection", 2007, Allegro Microsystems Inc. 18 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

Ausserlechner et al.; "Drift of Magnetic Sensitivity to Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner; "The piezo-Hall effect in n-silicon for arbitrary cyrstal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

(56) References Cited

OTHER PUBLICATIONS

Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation;" IEEE Sensors Journal; vol. 3, No. 6; Dec. 2003; pp. 752-790.
Haig; "Piezo-Hall Coefficients of n-Type Silicon;" Journal of Applied Physics; vol. 64, No. 1; Jul. 1, 1988; pp. 276-282.
Hosticka; "CMOS Sensor Systems;" Senors and Actuators A66; Apr. 1998; pp. 335-341.
Kanda et al.; "The Piezo-Hall Effect in n-Silicon;" $22^{nd}$ International Conference on the Physics of Semiconductors; vol. 1, Jan. 1995; pp. 89-92.
Krammerer et al.; "A Hall effect sensors network insensitive to mechanical stress;" Proceedings of IEEE Sensors; vol. 3, Oct. 2004; pp. 1071-1074.
Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.
Manic et al.; "Short and Long-Term Stability Problems of Hall Plates in Plastic Packages;" IEEE $38^{th}$ Annual International Reliability Physics Symposium; Apr. 2000; pp. 225-230.
Manic; "Drift in Silicon Integrated Sensors and Circuits Due to the Thermo-Mechnical Stresses;" Lausanne, Ecole Polytechnique Federate De Lausanne 2000; 170 pages.
Motz et al.; "An Integrated Magnetic Sensor with Two Continuous-Time $\Delta\Sigma$-Converters and Stress Compensation Capability;" IEEE International Solid-State Circuits Conference; Digest of Technical Papers; Feb. 6, 2006; ISBN: 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing;" IEEE Sensors 2006; Exco, Deegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuitry for a Smart Spinning-current Hail Plate with Low Offset;" Sensors and Actuators A; Jun. 1991;.pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic; "Sensor Microsystems;" Proc. $20^{th}$ International Conference on Microelectronics (MWIL 95); vol. 2, NIS, Serbia, Sep. 12-14, 1995; pp. 531-537.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" $5^{th}$ IEEE Conference on Sensors, Oct. 2007; pp. 1131-1134.
Ruther et al.; "Thermomagnetic Residual Offset in Integrated Hall Plates;" IEEE Sensors Journal; vol. 3, No. 6; Dec. 2003, pp. 693-699.
Sargent; "Switched-capacitor IC controls feedback loop;" EDN; Design Ideas; Feb. 17, 2000; pp. 154 and 156.
Schneider; "Temperature Calibration of CMOS Magnetic Vector Probe for Contactless Angle Measurement System," IEDM 1996 pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silcon Hall Devices;" $8^{th}$ International Conference on Solid-State Sensors and Actuators; vol. 2; Jun. 25, 1995; pp. 237-240.
Steiner et al.; "Double-Hall Sensor with Self-Compensated Offset;" International Electron Devices Meeting; Dec. 7, 1997; ISBN: 0-7803-4100-7; pp. 911-914.
Steiner et al; Offset Reduction in Hall Devices by Continuous Spinning Current Method; Sensors and Actuators A66; 1998, pp. 167-172.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Mulitple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Reference in Magnetic Field Sensors on Common Substrate;" WEP 1-6; IMTC; May 1994; pp. 461-463.
Udo; "Limits of Offset Cancellation by the Principle of Spinning Current Probe;" Proceedings of IEEE Senors; Oct. 2004; pp. 1117-1120.
Wu, et al.; "A Chopper Current-Feedback Instrumentation Amplifier with 1mHz 1/f Noise Corner and an AC-Coupled Ripple-Reduction Loop;" IEEE International Solid-State Circuits Conference; Feb. 10, 2009; pp. 322-324.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
PTO Notice of Allowance dated Feb. 11, 2011 for U.S. Appl. No. 12/037,393.
PTO Office Action dated Feb. 2, 2011 from U.S. Appl. No. 12/959,672.
PTO Notice of Allowance dated Jul. 19, 2011 for U.S. Appl. No. 12/959,672.
Preliminary Amendment filed on Oct. 5, 2010 for U.S. Appl. No. 12/706,318.
Office Action dated Jul. 6, 2012; for U.S. Appl. No. 12/706,318; 29 pages.
U.S. Notice of Allowance dated Dec. 10, 2012 for U.S. Appl. No. 12/706,318, 9 pages.
Office Action Sep. 11, 2012 from U.S. Appl. No. 12/840,324, 30 pages.
U.S. Reponse filed Dec. 11, 2012 to Office Action dated Sep. 11, 2012 for U.S. Appl. No. 12/840,324, 15 pages.
Final Office Action dated Feb. 12, 2013 for U.S. Appl. No. 12/840,324, 19 pages.
Letter to NTD Patent and Trademark Agency Ltd.; dated Dec. 11, 2012; with instructions to file Reponse to Official Action; for Chinese Pat. App. No. 200980106535.4; 3 pages.
Letter from NTD Patent and Trademark Agency Ltd.; dated Jan. 19, 2013; enclosing Response to Official Action; for Chinese Pat. App. No. 200980106535.4; 13 pages.
EP Official Communication; dated Feb. 23, 2012; for EP. Pat. App. No. 10739429.8; 2 pages.
European Response to Written Opinion dated Sep. 4, 2012 for European Patent Application No. 10739429.8, 11 pages.
European Notice of Allowance; dated Sep. 9, 2013 for European Pat. App. No. 10739429.8; 7 pages.
PCT Search Report and Written Opinion of the ISA for PCT/US2009/031776 dated Oct. 23, 2009.
PCT International Preliminary Report on Patentability and Written Opinion mailed Sep. 10, 2010 for PCT/US2009/031776.
PCT Search Report and Written Opinion of the ISA for PCT/US2010/024256 dated Aug. 11, 2010.

(56) References Cited

OTHER PUBLICATIONS

PCT International Preliminary Report on Patentability and Written Opinion of the ISA for PCT Pat. App. No. PCT/US2010/024256; dated Sep. 1, 2011; 9 pages.
PCT Search Report and Written Opinion of the ISA for PCT/US2010/042694 dated Sep. 27, 2010.
PCT International Preliminary Report on Patentability and Written Opinion of the ISA; dated Feb. 2, 2012; for PCT Patent Application No. PCT/US2010/042694; 11 sheets.
PCT Search Report and Written Opinion of the ISA for PCT Pat. App. No. PCT/US2012/032315; dated Jun. 22, 2012, 18 pages.
PCT Invitation to Pay Additional Fees and, Where Applicable, Protest Fee, PCT/US2013/071648, date of mailing Apr. 3, 2014, 7 pages.
PCT Search Report and Written Opinion of the ISA for PCT/US2013/071648 dated Jul. 23, 2014 23 pages.
U.S. Appl. No. 12/037,393, filed Feb. 26, 2008, Michael C. Doogue, et al.
U.S. Appl. No. 12/959,672, filed Dec. 3, 2010, Michael C. Doogue, et al.
U.S. Appl. No. 12/840,324, filed Jul. 21, 2010, Juan Manuel Cesaretti, et al.
U.S. Appl. No. 13/095,371, filed Apr. 27, 2011, Juan Manuel Cesaretti, et al.
PCT International Preliminary Report dated Apr. 4, 2017 for International Application No. PCT/US2015/051315; 14 Pages.

\* cited by examiner

MAGNETIC FIELD SENSORS WITH SELF TEST

FIELD

This disclosure relates to magnetic field sensors and, more particularly, to magnetic field sensors having self-test capabilities.

BACKGROUND

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

Magnets, in the form of a permanent magnet, or magnetically permeable structures, sometimes referred to as concentrators or flux guides, are often used in connection with magnetic field sensors. In applications in which the ferromagnetic target is magnetic, a magnetically permeable concentrator or magnetic flux guide can be used to focus the magnetic field generated by the target on the magnetic field transducer in order to increase the sensitivity of the sensor and, allow use of a smaller magnetic target, or allow the magnetic target to be sensed from a greater distance (i.e., a larger airgap). In other applications in which the ferromagnetic target is not magnetic, a permanent magnet, sometimes referred to as a back bias magnet, may be used to generate the magnetic field that is then altered by movement of the target.

During manufacturing or during use in application, magnetic field sensors (and other parts) sometimes present failures. These failures may be due to manufacturing defects, design defects, latent failures, or a combination of both. To reduce the occurrence of defective parts entering the field, parts are often tested during or after the manufacturing process. Some parts have been designed to include self-test capabilities, i.e. internal circuitry included in the part that can be used by the part to test itself during manufacturing. These self-tests may include built-in self-tests (i.e. "BIST" tests). During a so-called logical-BIST (i.e. an "LBIST" test), for example, the internal registers within the part are connected together in a scan chain so that the output of one leads to the input of the next. Data is fed through the scan chain and the result is compared to an expected value. If the result does not match the expected value, it may indicate there is a defect in the part. Certain parts may also include other types of BIST or self-test circuitry including tests that check the integrity of analog circuits.

SUMMARY

In an embodiment, a method includes detecting, by a magnetic field sensor, a magnetic field. A signal representing the magnetic field is driven onto an output node of the magnetic field sensor. The magnetic field sensor receives the signal on the output node and determines if the driven signal is interrupted by an external source. When the driven signal is interrupted, a self-test is initiated.

In another embodiment, an apparatus comprises an output node; a circuit to detect a magnetic field; and a processor circuit. The processor circuit is configured to transmit a signal representing the detected magnetic field onto the output node; detect whether the transmitted signal is interrupted by an external source; and, if the signal is interrupted, initiate a self-test of the apparatus.

In another embodiment, a system includes a magnetic target and a magnetic field sensor. The magnetic field sensor comprises an output node; a circuit to detect a magnetic field produced by the magnetic target; and a processor. The processor is configured to transmit a signal onto the output node representing the detected magnetic field; detect whether the transmitted signal is interrupted by an external source; and, if the signal is interrupted, initiate a self-test of the apparatus.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

Figure 1:
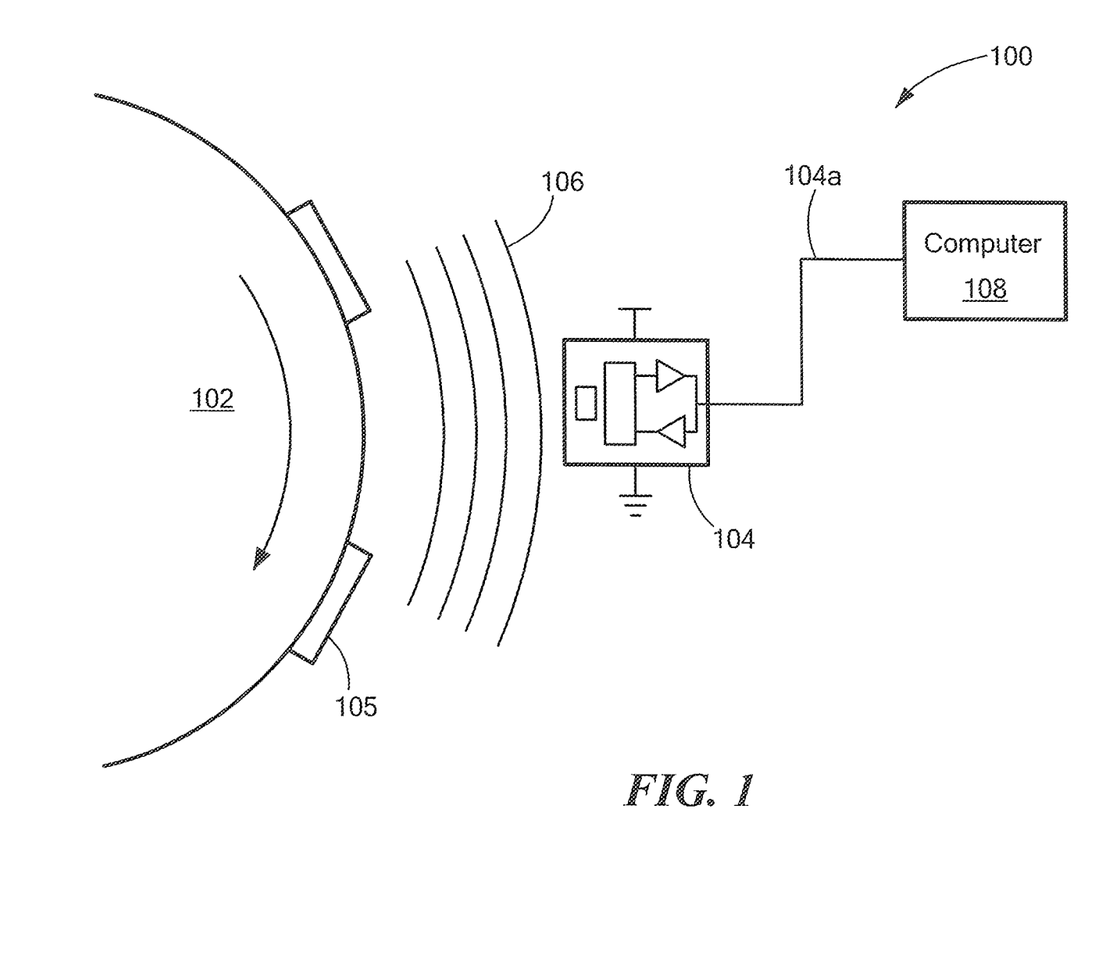
FIG. 1 is a block diagram of a system for detecting a magnetic target.

FIG. 1 is a block diagram of a system 100 for detecting a target 102. System 100 includes a magnetic field sensor 104 placed adjacent to target 102 so that a magnetic field 106 can be sensed by magnetic field sensor 104. In an embodiment, target 102 is a magnetic target and produces magnetic field 106. In another embodiment, magnetic field 106 is generated by a magnetic source (e.g. a back-bias magnet or electromagnet) that is not coupled to target 102. In this instance, target 102 may be either a magnetic or a non-magnetic target. In the case where the target is a non-magnetic target, as target 102 moves through or within magnetic field 106, it causes perturbations to magnetic field 106 that can be detected by magnetic field sensor 104.

Magnetic field sensor 104 may detect and process changes in magnetic field 106. For example, magnetic field sensor 104 may detect changes in magnetic field 106 as target 102 rotates and features 105 move closer to and away from magnetic field sensor 104, thus increasing and decreasing the strength of the magnetic field 106 sensed by magnetic field sensor 104. Magnetic field sensor 104 may include circuitry to determine the speed, direction, location, etc. of target 102 based on these changes to magnetic field 106.

In an embodiment, magnetic sensor 104 is coupled to a computer 108, which may be a general purpose processor executing software or firmware, a custom processor, or an electronic circuit for processing output signal 104a from magnetic sensor 104. Output signal 104a may provide information about the speed and/or direction of target 102 to computer 108, which may then perform operations based on the received speed and direction. In an embodiment, computer 108 is an automotive computer installed in a vehicle and target 102 is a moving part within the vehicle, such as a transmission shaft, a brake rotor, etc. Magnetic sensor 104 detects the speed and direction of target 102 and computer 108 controls automotive functions (like all-wheel drive, ABS, speedometer display control, etc.) in response to the detected speed and direction.

In an embodiment, computer 108 may be located relatively distant from magnetic field sensor 104. For example, computer 108 may be located under the hood of a vehicle while magnetic field sensor 104 is located at a wheel or transmission element near the bottom of the vehicle. In such an embodiment, having a serial communication interface with a minimal number of electrical connections (e.g. wires) between computer 108 and magnetic field sensor 104 may be beneficial, and may reduce cost and maintenance requirements.

Figure 2:
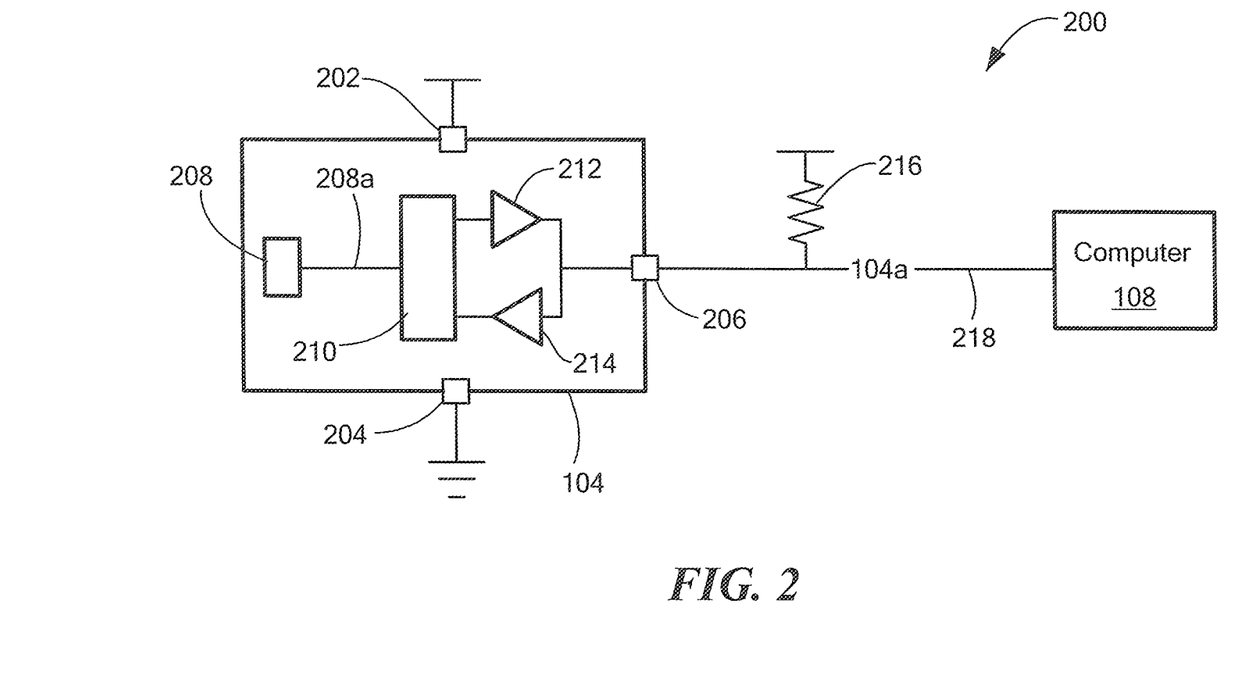
FIG. 2 is a block diagram of a system for detecting a magnetic target.

Referring now to FIG. 2, a system 200 for detecting a magnetic field may be the same as or similar to system 100 of FIG. 1. System 200 includes magnetic field sensor 104 coupled to computer 108. Magnetic field sensor 104 may be a so-called three wire sensor, indicating that the sensor has three electrical pins with which to make electrical connections with external circuits. These pins may include a power pin 202, a ground pin 204, and a communication or I/O pin 206. In other embodiments, magnetic field sensor may include additional input and/or output pins for performing other functions related to detecting magnetic field 106. In another example, pin 206 (and/or pin 202 and pin 204) may be nodes that are accessible outside of a chip package, such as an externally-accessible node of an integrated circuit packaged in a chip-scale package. As another example, pin 206 (and/or pin 202 and pin 204) may be internal nodes that are not accessible from outside of the chip and its package.

Magnetic field sensor 104 may also include a magnetic field sensing circuit 208, which may comprise Hall elements, magnetoresistive elements, and/or other circuitry and components for detecting a magnetic field. Magnetic field sensing circuit 208 produces a signal 208a that represents the magnetic field detected by magnetic field sensing circuit 208. Signal 208a may be a digital or analog signal.

A processor 210 is coupled to receive signal 208a. Processor 210 may comprise a custom circuit for processing signal 208. In another embodiment, processor 210 may comprise a generic processor such as a microprocessor and a memory. The memory may contain software instructions which, when executed by the processor, cause processor 210 to perform functions and provide features for processing signal 208a. In another embodiment, processor 210 may comprise a combination of custom circuitry, a generic processor, and software for processing signal 208a.

Magnetic field sensor 104 may be an integrated circuit and may include other circuits not shown or described in this document.

In an embodiment, processor 210 and/or the other circuits included in magnetic field sensor 202 are capable of performing a self-test such as an analog and/or digital BIST test. A BIST test may be used during manufacturing to ensure that the magnetic field sensor 104 has been manufactured properly and operates without defects. In an embodiment, a BIST test may be any type of self-test that magnetic field sensor 202 is capable of performing, and may be triggered by communications received from an external source such as computer 108, from an internal source, or by an event such as start-up or power-on of magnetic field sensor 202. The BIST test may be performed while the magnetic field sensor is installed and operating in a vehicle or in another type of system.

Processor 210 includes (or is coupled to) an output driver circuit 212. Output driver circuit 212 may be capable of driving communication signal 104a on pin 206 and communication line 218 so that communication signal 104a can be received by computer 108. In an embodiment, communication line 218 may be an internal node, i.e. a node that may or may not be connected to an external pin, of magnetic field sensor 104. In an embodiment, processor 210 also includes (or is coupled to) an input driver circuit 214 capable of reading communication signal 104a on pin 206. Communication signal 104a may be a two-way communication signal that can be driven by magnetic field sensor 104, by computer 108, or by both. In an embodiment, communication signal 104a is a SENT protocol signal, an I2C protocol signal, an SMBUS protocol signal, a pulse-width modulated based signal, or another type of one-wire, two-way, serial communication signal.

Although the example shown in FIG. 2 describes one-wire communication, other configurations are possible. For example, communication line 218 may include a plurality of conductors that carry serial or parallel communications, or may comprise wireless communications.

As shown, a pull-up resistor 216 is coupled between communication line 218 and a voltage reference. Pull up resistor 216 is shown external to magnetic field sensor 104 and computer 108, but could be included within magnetic field sensor 104, computer 108, or both. Pull-up resistor 216 acts to maintain the voltage on communication line 218 at a logic-high voltage level during communication idle state. When magnetic field sensor 104 drives a communication signal 104a on communication line 218, magnetic field sensor 104 overdrives the pull-up resistor 216 to cause the voltage on communication line 218 to go to a logic-low level. In an embodiment, magnetic field sensor 104 may couple communication line 218 to a ground reference in order to drive a logic-low voltage level on communication line 218. Magnetic field sensor 104 may then release (e.g. tri-state) output driver circuit 212 to allow the voltage on communication line 218 to return to a high voltage level via pull-up resistor 216. Alternatively, output driver circuit 212 may actively drive the voltage on communication line 218 to a high level to produce a logic-high voltage. Computer 108 may drive communication line 218 in similar fashion, i.e. by driving the line low to produce a logic-low signal and releasing or driving the line to produce a logic-high.

If output driver circuit 212 is configured to actively drive a logic-high level on communication 218, computer 108 may be configured with a relatively lower-resistance output driver circuit so that computer 108 can overdrive the logic-high generated by output driver circuit 212, as discussed below. One skilled in the art will recognize that other communication signal driving circuits can be used. For example, a pull-down resistor could be used where magnetic field sensor 104 and/or computer 108 drive communication line 218 to a logic-high voltage, and release communication line 218 to allow it to return to a logic-low voltage. For example, a differential signal may be used where one conductor of communication line 218 is normally held at a logic-high level and another conductor of communication line 218 is normally held at a logic-low level. In such an embodiment, magnetic field sensor 104 may drive the normally high conductor to a low level and release it to return to a high level, and may drive the normally low conductor to a high level and release it to allow it to return to a low level.

Magnetic field sensor 104 may drive output communications on communication line 218 according to various protocols. In one embodiment, magnetic field sensor 104 constantly or periodically drives an output signal on communication line 218 representing the detected magnetic field. In another embodiment, magnetic field sensor 104 operates in a so-called triggered mode where it waits for a request from computer 108 and, in response to the request, sends data representing the detected magnetic field onto communication line 218. In some embodiments, magnetic field sensor 104 may communicate by sending digital data. In other embodiments magnetic field sensor 104 may communication by encoding data in a pulse-width modulated signal.

Figure 3:
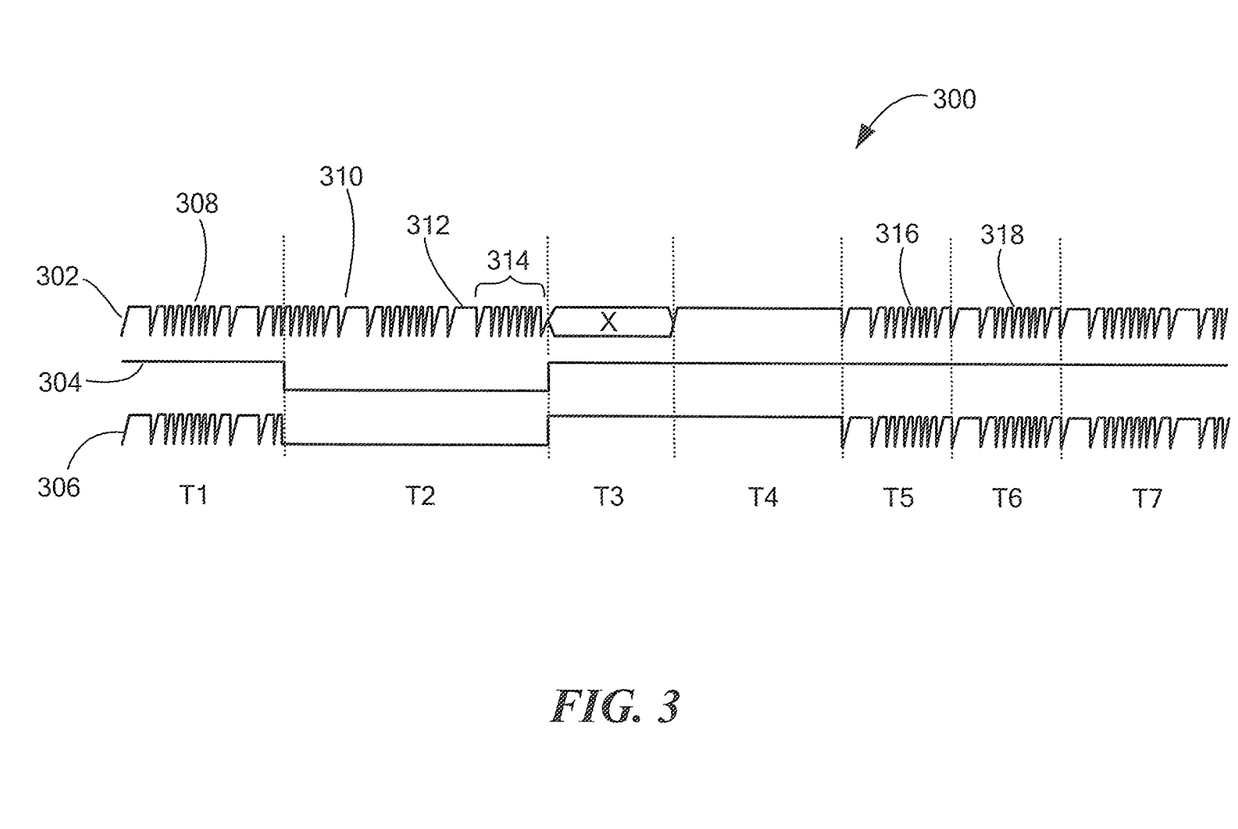
FIG. 3 is a timing diagram of serial communications.

Referring to FIG. 3, communication timing diagram 300 includes three waveforms: waveform 302 is an example of a communication signal driven by output communication circuit 212 of magnetic field sensor 104, waveform 304 is an example of a communication signal driven by computer 108, and waveform 306 is an example of the resulting signal 104a on communication line 218. The waveforms in communication timing diagram 300 correspond to a one-wire communication protocol such as the SENT protocol, I2C, SMBus, etc.

Time period T1 represents normal operation of the magnetic field sensor 104 as it is installed in a system and detecting magnetic field 106. During T1, magnetic field sensor 104 constantly or periodically sends data 308 onto communication line 218. As described above, magnetic field sensor 104 may drive communication line 218 low to produce a logic-low value and release it to allow it to return to a logic-high value.

Data 308 may be digital data in the form of bytes or words driven serially onto communication line 218. During normal operation, computer 108 may receive data 308 and use it for various functions. For example, if magnetic field sensor is installed in an automotive braking system, computer 108 may use data 308 to determine whether to engage an anti-lock brake. As another example, if magnetic field sensor 104 is installed in an automatic transmission system, computer 108 may use data 308 to determine how and when to switch gears.

During time period T1, computer 108 typically does not drive an output signal onto communication line 218 and allows communication line 218 to be controlled and driven by output driver circuit 212 of magnetic field sensor 104. Accordingly, waveform 304, the communication driven by computer 108, is shown in a tri-state or high-impedance state during T1. Accordingly, waveform 306 (the signal on communication line 218) follows waveform 302 (the signal driven by magnetic field sensor 104) during time period T1. During operation, magnetic field sensor 104 may also read the data 308 on communication line 218, via receiver 214 for example, to determine whether the data driven by magnetic field sensor 104 appears on communication line 218.

During time period T2 computer 108 sends a request for magnetic field sensor 104 to perform a self-test. In an embodiment, the request is sent by computer 108 driving a logic-low signal onto communication line 218, as shown by the low-voltage value of waveform 304. By driving communication line 218 to a low-voltage, computer 108 prevents communication line from returning to a high-voltage (i.e. logic-high) level during time period T2. Accordingly, even though magnetic field sensor 104 is attempting to drive data 310 onto communication line 212, computer 108 effectively interrupts magnetic field sensor 104's data signal by pulling the communication line low so that data 310 does not appear on communication line 218. Accordingly, waveform 306 follows waveform 304 during time period T2.

In an embodiment, internal circuitry and/or software in magnetic field sensor 104 can initiate the self-test. For example, magnetic field sensor 104 may include an internal timer and/or interrupt (not shown) that initiates the self-test. The internal circuitry may also include sensors, logic circuits, or other circuits to initiate the self-test. The internal circuitry may initiate the self-test by generating a trigger signal, which may be the same as or similar to trigger signals described below.

In another embodiment, magnetic field sensor 104 may trigger the self-test based on an event-based trigger, such as start-up or power-on of magnetic field sensor 104.

Magnetic field sensor 104 may also include functions so that the self-test can be triggered by any one of: an external trigger, an internal trigger, an event-based trigger, or a combination thereof.

As noted above, magnetic field sensor 104 may read the data on communication line 218. During time period T2, magnetic field sensor 104 may typically expect to read the same data that it is driving onto the communication line. However, because computer 108 is driving the line low, communication line 218 cannot return to a logic-high voltage level when magnetic field sensor 104 releases the line. Thus, when computer 108 is driving communication line low, computer 108 will effectively hold the line low and interrupt the data 310 that magnetic field sensor 104 is driving—waveform 306 will follow waveform 304 during time period T2 and magnetic field sensor 104 can detect the request by sensing the logic-low level on the communication line instead of the expected data.

In an embodiment, magnetic field sensor 108 detects the request when communication line 218 has been held low for a predetermined number of data transmissions or for a predetermined time. For example, when using the SENT, I2C, or SMBus protocol, magnetic field sensor 104 will send data packets comprising a start bit 312 followed by a nibble, byte, or word of data 314. If magnetic field sensor 104 detects that communication line 218 has been held low for the duration the attempted transmission of at least two of these packets, for example, magnetic field sensor 104 may determine that it has received a request to perform a self-test. In other embodiments, magnetic field sensor 104 may determine that it has received a request to perform a self-test if it detects that the communication line 218 has been interrupted by computer 108 for the duration of one packet, for the duration of two packets, for the duration of more than two packets, or for a specific time period such as 1 millisecond, 10 milliseconds, 100 milliseconds, etc. Any number of packets or any time period can be chosen for detection of the request to perform a self-test.

In an embodiment, magnetic field sensor 104 may receive the request to perform a self-test while magnetic field sensor 104 is installed in a system and operating under normal conditions. For example, computer 108 may send the request to perform a self-test while magnetic field sensor 104 is installed, in situ, in an automotive brake or transmission system. In such situations, computer 108 may send the request during a time period where the data produced by magnetic field sensor 104 is not critical for operation. In an automotive system, computer 108 may send the request immediately after vehicle ignition and before the vehicle is put in motion. As another example, computer 108 may send the request while the engine is off but the vehicle battery is enabled. If magnetic field sensor 104 is installed in other types of systems, such as in a manufacturing environment, computer 108 may send the request during a time when the manufacturing line is not operating, for example.

Once magnetic field sensor 104 receives the request, it may perform a self-test during time period T3. The self-test may comprise a BIST test that tests the internal circuitry of magnetic field sensor 104. The self-test may include tests that verify the integrity of digital circuitry, analog circuitry, or both within magnetic field sensor 104.

During time period T4, magnetic field sensor may complete the self-test. In some BIST tests, the inputs and outputs of digital circuitry to be tested are reconnected to form scan chains through which test patterns of data are sent. In this instance, magnetic field sensor 104 may remove the scan chains and reconnect the inputs and outputs of the circuitry to resume a normal operating mode during time period T4, in order to resume subsequent operations.

In an embodiment, neither computer 108 nor magnetic field sensor 104 drives communication line 218 during time periods T3 and T4. Thus, during T3 and T4, the pull-up resistor 216 pulls the voltage on communication line 218 to a logic-high level, as shown in FIG. 3.

During time period T5 and T6, magnetic field sensor 104 may transmit the results of the self-test onto communication line 218, in the form of one or more data packets 316 and 318, for example. In some embodiments, magnetic field sensor 104 transmits the results of the self-test onto an internal node of magnetic field sensor 104. In such embodiments, the test results may not appear on communication line 218. In other embodiments, magnetic field sensor 104 transmits the self-test results onto an output pin (e.g. output pin 206), where they can be received externally by computer 108.

In certain embodiments, magnetic field sensor 104 will transmit the results of the self-test onto communication line 218 only if the results indicate a failure. If the results indicate a passing result, magnetic field sensor 104 may resume normal operations and send data representing the magnetic field instead of transmitting test results onto communication line 218. In other embodiments, magnetic field sensor 104 will transmit the results only if the test results indicate a passing results. In yet other embodiments, magnetic field sensor 104 will transmit the test results onto communication line 218 regardless of whether the test results indicate pass or fail.

Data packets 316 and 318 may include information about whether the self-test passed or failed, as well as other qualitative test results such as a value of a test measurement, etc. In embodiments, the test results may comprise fewer or more than the two data packets shown in FIG. 3. The test results may take the form of any communication or signal that can be received by computer 108.

In time period T7, magnetic field sensor 104 may resume normal operations and transmit data representing the detected magnetic field.

Figure 4:
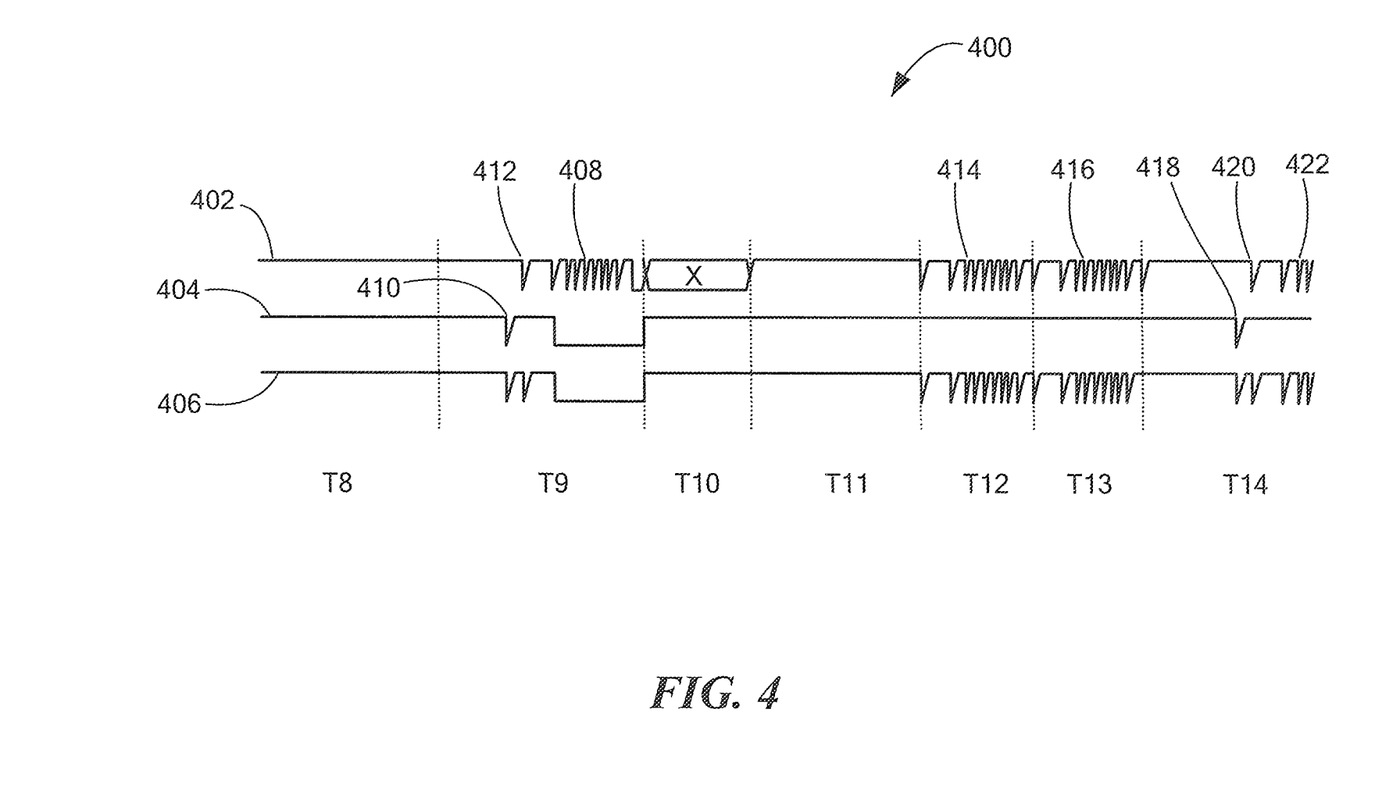
FIG. 4 is a timing diagram of serial communications.

Referring to FIG. 4, the waveforms in communication timing diagram 400 correspond to a triggered communication protocol based on, for example, a one-wire communication protocol such as the SENT protocol, I2C, SMBus, etc. Communication timing diagram 400 includes three waveforms: waveform 402 is an example of a communication signal driven by output communication circuit 212 of magnetic field sensor 104, waveform 404 is an example of a communication signal driven by computer 108, and waveform 406 is an example of the resulting signal 104a on communication line 218.

Time period T8 represents normal operation of the magnetic field sensor 104 as it is installed in a system and detecting magnetic field 106. During T8, magnetic field sensor 104 waits to receive a trigger from computer 108. Upon receiving the trigger, magnetic field sensor 104 will transmit data (e.g. data such as data 408 shown in time period T9) representing the detected magnetic field to computer 108. As described above, magnetic field sensor 104 may drive communication line 218 low to produce a logic-low value and release it to allow it to return to a logic-high value.

Data 408 may be digital data in the form of bytes or words driven serially onto communication line 218. During normal operation, computer 108 may receive data 408 and use it for various functions. For example, if magnetic field sensor is installed in an automotive braking system, computer 108 may use data 408 to determine whether to engage an anti-lock brake. As another example, if magnetic field sensor 104 is installed in an automatic transmission system, computer 108 may use data 408 to determine how and when to switch gears.

Because neither magnetic field sensor 104 nor computer 108 are driving communication line 218 low in time period T8, waveform 406 (the signal on communication line 218) remains high.

During time period T9 computer 108 sends a request for magnetic field sensor 104 to perform a self-test. In an embodiment, computer 108 sends a trigger 410 instructing magnetic field sensor 104 to transmit data. In an embodiment computer 108 sends the trigger signal by driving communication line 218 low for a predetermined period of time, or for a predetermined number of pulses. However, the trigger signal may take the form of any signal that can be received and identified by magnetic field sensor 108. For example, the trigger may be received when computer 108 drives communication line 218 for a combination of a number of pulses and a duration of time. As an example, computer 108 may drive communication line 218 for the duration of two pulses or more that are separated by a period of time. In another embodiment, computer 108 may drive a signal that is received by magnetic field sensor 108 in order to trigger the self-test.

Once the trigger is received, magnetic field sensor 104 may transmit an acknowledgement 412 to computer 108. In an embodiment magnetic field sensor 104 sends the acknowledgement by driving communication line 218 low for a predetermined period of time. However, the acknowledgement may take the form of any signal that can be received and identified by computer 108. In some embodiments, magnetic field sensor 104 may optionally omit sending an acknowledgement.

After the acknowledgement 412, magnetic field sensor 104 may transmit data 408 representing the detected magnetic field. Under normal operation, computer 108 may receive data 408 for processing. In other circumstances, computer 108 may request that magnetic field sensor 104 perform a self-test. The request may be sent by computer 108 driving a logic-low signal onto communication line 218 while magnetic field sensor 104 is attempting to transmit data 408, as shown by the low-voltage value of waveform 404 during time period T9. By driving communication line 218 to a low-voltage, computer 108 prevents communication line from returning to a high-voltage (i.e. logic-high) level during time period T9. Accordingly, even though magnetic field sensor 104 is attempting to drive data 408 onto communication line 212, computer 108 effectively interrupts magnetic field sensor 104's data signal by pulling the communication line low so that data 408 does not appear on communication line 218. Accordingly, waveform 406 follows waveform 404 during time where waveform 404 is held low.

As noted above, magnetic field sensor 104 may read the data on communication line 218. During time period T9, magnetic field sensor 104 may typically expect to read the same data 408 that it is driving onto the communication line. However, because computer 108 is driving the line low, communication line 218 cannot return to a logic-high voltage level when magnetic field sensor 104 releases the line. Thus, when computer 108 is driving communication line low, magnetic field sensor 104 can detect the request by sensing the logic-low level on the communication line instead of the expected data.

In an embodiment, magnetic field sensor 108 detects the request when communication line 218 has been held low for a predetermined number of data transmissions or for a predetermined time. For example, when using a triggered protocol based on the SENT, I2C, or SMBus protocol, if magnetic field sensor 104 detects that communication line 218 has been held low for the duration of the attempted transmission of one data packet transmission, a portion of one data packet transmission, two data packet transmissions, or for any other duration, magnetic field sensor 104 may determine that it has received a request to perform a self-test. In other embodiments, magnetic field sensor 104 may determine that it has received a request to perform a self-test if it detects that the communication line 218 has been interrupted by computer 108 for a specific time period such as 1 microsecond, 10 microseconds, 100 microseconds, 1 millisecond, 10 milliseconds, 100 milliseconds, etc. Any number of packets or any time period can be chosen for detection of the request to perform a self-test. For example, the trigger may be received when computer 108 drives communication line 218 for a combination pulses and time. As an example, computer 108 may drive communication line 218 for the duration of two pulses (or more) that are separated by a period of time. The pulses and duration may be of any length of time. In another embodiment, computer 108 may drive a signal that is received by magnetic field sensor 108 in order to trigger the self-test.

Once magnetic field sensor 104 receives the request, it may perform a self-test during time period T10. The self-test may comprise a BIST test that tests the internal circuitry of magnetic field sensor 104. The self-test may also include tests that verify the integrity of digital circuitry, analog circuitry, or both within magnetic field sensor 104.

During time period T11, magnetic field sensor may complete the self-test. In some BIST tests, scan chains to test the digital circuitry and registers in the device. In this instance, magnetic field sensor 104 may revert to a normal operating mode by, for example, removing the scan chains during time period T11 to resume subsequent operations.

In an embodiment, neither computer 108 nor magnetic field sensor 104 drives communication line 218 during time periods T10 and T11. Thus, during T10 and T11, the pull-up resistor 216 pulls the voltage on communication line 218 (i.e. waveform 406) to a logic-high level.

During time period T12 and T13, magnetic field sensor may transmit the results of the self-test onto communication line 218, which may be in the form of one or more data packets 416 and 418, for example. In some embodiments, magnetic field sensor 104 transmits the results of the self-test onto an internal node of magnetic field sensor 104. In such embodiments, the test results may not appear on communication line 218. In other embodiments, magnetic field sensor 104 transmits the self-test results onto an output pin (e.g. output pin 206), where they can be received externally by computer 108.

In certain embodiments, magnetic field sensor 104 will transmit the results of the self-test onto communication line 218 only if the results indicate a failure. If the results indicate a passing result, magnetic field sensor 104 may resume normal operations and send data representing the magnetic field instead of transmitting test results onto communication line 218. In other embodiments, magnetic field sensor 104 will transmit the results only if the test results indicate a passing results. In yet other embodiments, magnetic field sensor 104 will transmit the test results onto communication line 218 regardless of whether the test results indicate pass or fail.

Data packets 414 and 416 may include information about whether the self-test passed or failed, as well as other qualitative test results such as a value of a test measurement, etc. In embodiments, the test results may comprise fewer or more than the two data packets shown in FIG. 4. The test results may take the form of any communication or signal that can be received by computer 108.

In time period T14, magnetic field sensor 104 may resume normal operations and wait to receive subsequent triggers 418, and in response transmit an acknowledgement 420 and data 422. During normal operations, when no self-test is requested, data 422 will appear on communication line 218 (i.e. waveform 406) as shown in FIG. 4.

Figure 5:
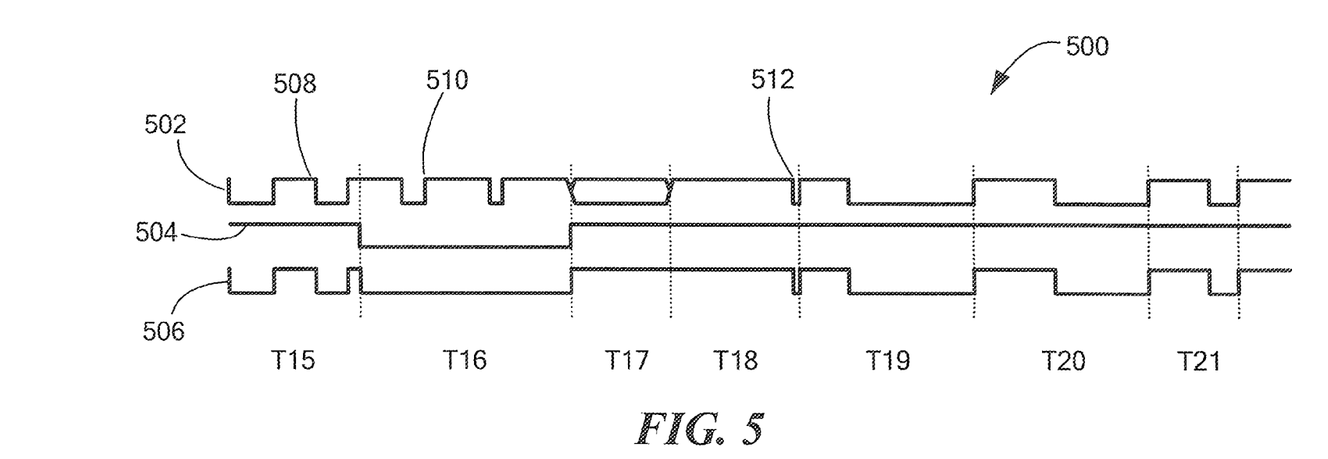
FIG. 5 is a timing diagram of serial communications.

Turning to FIG. 5, the waveforms in communication timing diagram 500 correspond to a pulse-width modulated ("PWM") communication protocol. Communication timing diagram 500 includes three waveforms: waveform 502 is an example of a communication signal driven by output communication circuit 212 of magnetic field sensor 104, waveform 504 is an example of a communication signal driven by computer 108, and waveform 506 is an example of the resulting signal 104a on communication line 218.

Time period T15 represents normal operation of the magnetic field sensor 104 as it is installed in a system and detecting magnetic field 106. During T15, magnetic field sensor 104 constantly or periodically drives PWM data 508 onto communication line 218. In an embodiment, data representing the magnetic field may be encoded as a duty-cycle and/or frequency of the PWM waveform. For example, a larger duty cycle may correspond to a stronger detected magnetic field.

As described above, magnetic field sensor 104 may drive communication line 218 low to produce low periods of the PWM signal and release it to allow it to return to a logic-high value during high-voltage periods of the PWM signal.

During normal operation, computer 108 may receive PWM data 508 and use it for various functions. For example, if magnetic field sensor is installed in an automotive braking system, computer 108 may use PWM data 508 to determine whether to engage an anti-lock brake. As another example, if magnetic field sensor 104 is installed in an automatic transmission system, computer 108 may use PWM data 508 to determine how and when to switch gears.

During time period T15, computer 108 typically does not drive an output signal onto communication line 218 and allows communication line 218 to be controlled and driven by output driver circuit 212 of magnetic field sensor 104. Accordingly, waveform 504, the communication driven by computer 108, is shown in a tri-state or high-impedance state during T1, and waveform 506 (the signal on communication line 218) follows waveform 502 (the signal driven by magnetic field sensor 104) during time period T15. During operation, magnetic field sensor 104 may also read the PWM data 508 on communication line 218 to determine whether the data driven by magnetic field sensor 104 appears on communication line 218.

During time period T16 computer 108 sends a request for magnetic field sensor 104 to perform a self-test. In an embodiment, the request is sent by computer 108 driving a logic-low signal onto communication line 218, as shown by the low-voltage value of waveform 504 during time period T16. By driving communication line 218 to a low-voltage, computer 108 prevents communication line from returning to a high-voltage (i.e. logic-high) level during time period T16. Accordingly, even though magnetic field sensor 104 is attempting to drive PWM data 510 onto communication line 212, computer 108 effectively interrupts magnetic field sensor 104's data signal by pulling the communication line low so that PWM data 510 does not appear on communication line 218. Accordingly, waveform 506 follows waveform 504 during time period T16.

As noted above, magnetic field sensor 104 may read the data on communication line 218. During time period T16, magnetic field sensor 104 may typically expect to read the same PWM data 510 that it is driving onto the communication line. However, because computer 108 is driving the line low, communication line 218 cannot return to a logic-high voltage level when magnetic field sensor 104 releases the line. Thus, when computer 108 is driving communication line low, computer 108 will effectively hold the line low and interrupt the PWM data 510 that magnetic field sensor 104 is driving-waveform 506 will follow waveform 504 during time period T16 and magnetic field sensor 104 can detect the request by sensing the logic-low level on the communication line instead of the expected data.

In an embodiment, magnetic field sensor 108 detects the request when communication line 218 has been held low for a predetermined number PWM cycles (i.e. periods). For example, if magnetic field sensor 104 detects that communication line 218 has been held low for a time equal to or greater than one or more PWM cycles, magnetic field sensor 104 may determine that it has received a request to perform a self-test. In other embodiments, magnetic field sensor 104 may determine that it has received a request to perform a self-test if it detects that the communication line 218 has been interrupted by computer 108 for the duration of a specific time period such as 1 microsecond, 10 microseconds, 100 microseconds, 1 millisecond, 10 milliseconds, 100 milliseconds, etc. Any number of PWM cycles or any time period can be chosen for detection of the request to perform a self-test.

In an embodiment, magnetic field sensor 104 may receive the request to perform a self-test while magnetic field sensor 104 is installed in a system and operating under normal conditions. For example, computer 108 may send the request to perform a self-test while magnetic field sensor 104 is installed, in situ, in an automotive brake or transmission system, for example. In such situations, computer 108 may send the request during a time period where the data produced by magnetic field sensor 104 is not critical for operation. For example, in an automotive system, computer 108 may send the request immediately after vehicle ignition and before the vehicle is put in motion. As another example, computer 108 may send the request while the engine is off but the vehicle battery is enabled. If magnetic field sensor 104 is installed in other types of systems, such as in a manufacturing environment, computer 108 may send the request during a time when the manufacturing line is not operating, for example.

Once magnetic field sensor 104 receives the request, it may perform a self-test during time period T17. The self-test may comprise a BIST test that tests the internal circuitry of magnetic field sensor 104. The self-test may include tests that verify the integrity of digital circuitry, analog circuitry, or both within magnetic field sensor 104.

During time period T18, magnetic field sensor may complete the self-test. In some BIST tests, the inputs and outputs of digital circuitry to be tested are reconnected to form scan chains through which test patterns of data are sent. In this instance, magnetic field sensor 104 may remove the scan chains and reconnect the inputs and outputs of the circuitry to resume a normal operating mode during time period T18, in order to resume subsequent operations.

In an embodiment, neither computer 108 nor magnetic field sensor 104 drives communication line 218 during time periods T17 and T18. Thus, during T17 and T18, the pull-up resistor 216 pulls the voltage on communication line 218 to a logic-high level, as shown in FIG. 5.

In an embodiment, magnetic field sensor 104 may signal that it has recovered and is ready to send self-test results by driving a ready signal, such as pulse 512, on communication line 218. During time period T19 and T20, magnetic field sensor may transmit the results of the self-test onto communication line 218. In some embodiments, magnetic field sensor 104 transmits the results of the self-test onto an internal node of magnetic field sensor 104. In such embodiments, the test results may not appear on communication line 218. In other embodiments, magnetic field sensor 104 transmits the self-test results onto an output pin (e.g. output pin 206), where they can be received externally by computer 108.

In an embodiment, the self-test results are transmitted in the form of a PWM signal with a frequency that differs from that of the PWM signal used for normal data operations. For example, the PWM signal used for test results may have a frequency that is half of the normal frequency, as shown in FIG. 5. The test results may take the form of any communication or signal that can be received by computer 108.

In certain embodiments, magnetic field sensor 104 will transmit the results of the self-test onto communication line 218 only if the results indicate a failure. If the results indicate a passing result, magnetic field sensor 104 may resume normal operations and send data representing the magnetic field instead of transmitting test results onto communication line 218. In other embodiments, magnetic field sensor 104 will transmit the results only if the test results indicate a passing results. In yet other embodiments, magnetic field sensor 104 will transmit the test results onto communication line 218 regardless of whether the test results indicate pass or fail.

In time period T21, magnetic field sensor 104 may resume normal operations and transmit data representing the detected magnetic field.

Figure 6:
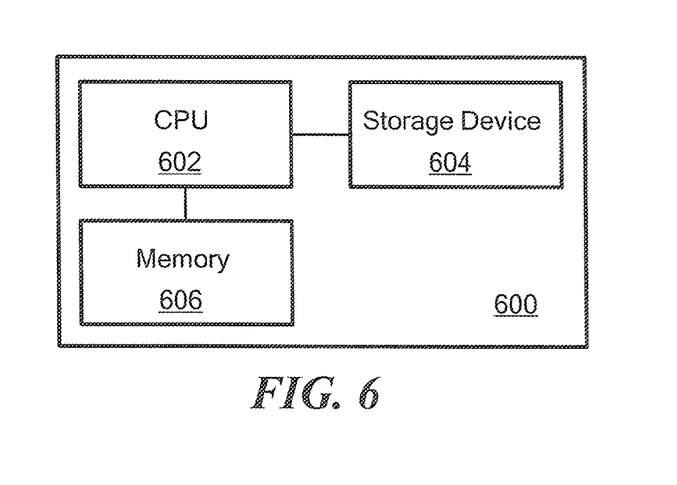
FIG. 6 is a block diagram of a computational circuit.

FIG. 6 is a block diagram of a computational circuit 600, can perform at least some of the processing described above. Computational circuit 600 may be the same as or similar to processor 210 in FIG. 2, for example.

Computational circuit 600 may include a central processing unit (CPU) 602 coupled to a storage device 604 and a memory 606. CPU 602 can be a general purpose processor, a custom-designed processor, a microprocessor, or any other type of processor or circuit that can execute software instructions.

Storage device 604 comprises a non-volatile memory such as a ROM, flash memory, F-RAM, solid-state drive, EPROM, EEPROM, and the like. Storage device 604 may be either read-only or read/write. In other embodiments, storage device 604 is a hard-drive, DVD, CD, or other type of disc device.

Memory 606 comprises a volatile memory, such as a RAM. In certain embodiments, RAM 606 may be omitted from computational circuit 600.

In operation, CPU 602 may read and execute software instructions from storage device 604 and/or memory 606. When executed, the instructions may cause CPU 602 to perform functions and operations as described above with respect to processor 210. In certain embodiments, CPU 602 may copy the instructions from storage device 604 to memory 606 prior to executing the instructions. CPU 602 may also read and write data to and from storage device 604 and memory 606. In other embodiments, computational circuit may comprise programmable hardware logic (e.g. a PLA), an FPGA, an ASIC, or any other type of hardware circuit or device capable of performing at least some of the functions described above and/or executing software instructions that cause the computational circuit to perform at least some of the functions described above.

Having described various embodiments, which serve to illustrate various concepts, structures and techniques, which are the subject of this patent, it will now become apparent to those of ordinary skill in the art that other embodiments incorporating these concepts, structures and techniques may be used. Elements of different embodiments described in this patent may be combined to form other embodiments not specifically set forth above. Various elements, which are described in the context of a single embodiment, may also be provided separately or in any suitable subcombination, Other embodiments not specifically described herein are also within the scope of the following claims. Accordingly, the scope of the patent should not be limited to the described embodiments but rather should be limited only by the spirit and scope of the following claims. All references cited within this patent are incorporated by reference in their entirety.

The invention claimed is:

1. A method comprising:
   detecting, by a magnetic field sensor, a magnetic field;
   driving a signal representing the magnetic field onto an output node of the magnetic field sensor;
   receiving, by the magnetic field sensor, the signal on the output node;
   determining if the driven signal is interrupted by an external source by comparing the received signal to the driven signal by determining if a voltage of the output node was driven to a predetermined voltage state during transmission of the signal representing the magnetic field;
   interrupting the signal representing the magnetic field and when the driven signal is interrupted, initiating a self-test.

2. The method of claim 1 further comprising driving a signal representing results of the self-test onto an output pin.

3. The method of claim 2 wherein driving the signal representing the results includes driving the signal only if the results of the self-test indicate a failure.

4. The method of claim 1 wherein detecting the magnetic field comprises sensing the presence of a magnetic target.

5. The method of claim 1 wherein detecting the magnetic field comprises detecting the magnetic field while the magnetic field sensor is installed in a working system.

6. The method of claim 1 wherein detecting the magnetic field comprises detecting the magnetic field while the magnetic field sensor is installed in a transmission or braking system.

7. The method of claim 1 wherein interrupting the output signal comprises interrupting the output signal during a predetermined time period.

8. The method of claim 7 wherein the predetermined time period is a time where output from the magnetic field sensor is not necessary for system operation.

9. The method of claim 1 wherein initiating the self-test comprises performing, by the magnetic field sensor, a BIST or LBIST test; and driving the signal representing the results comprises sending test results from the BIST or LBIST test.

10. The method of claim 1 further comprising, subsequent to driving the signal representing the results of the self-test, resuming to detect the magnetic field.

11. The method of claim 1 further comprising receiving a request to send the signal representing the magnetic field.

12. The method of claim 1 further comprising operating, by the magnetic field sensor, in a continuous communications mode, a PWM communications mode, or a triggered communications mode.

13. The method of claim 1 wherein driving the signal representing the magnetic field includes transmitting a digital signal onto the output pin.

14. The method of claim 1 wherein driving the signal representing the magnetic field includes transmitting an analog signal onto the output pin.

15. The method of claim 1 wherein driving the signal comprises sending communications onto the output node according to a SENT protocol.

16. The method of claim 1 wherein the output node is coupled to an output pin of the magnetic field sensor.

17. An apparatus comprising:
an output node;
a circuit to detect a magnetic field;
a processor circuit configured to:
transmit a signal representing the detected magnetic field onto the output node;
detect whether the transmitted signal is interrupted by an external source by sensing whether the output node is held at a low voltage by the external source; and
if the signal is interrupted, initiate a self-test of the apparatus.

18. The apparatus of claim 17 wherein the processor circuit is further configured to transmit a signal representing results of the self-test onto the output node.

19. The apparatus of claim 17 wherein the processor is further configured to resume normal operation of the apparatus after transmitting the signal.

20. The apparatus of claim 17 wherein initiating the self-test comprises performing, by the apparatus, a BIST or LBIST test; and the signal representing results from self-test includes results from BIST or LBIST test.

21. The apparatus of claim 17 wherein the processor is further configured to receive a request prior to transmitting the signal representing the magnetic field.

22. The apparatus of claim 17 wherein the processor is further configured to transmit the signal representing the magnetic field in a continuous communications mode, a PWM communications mode, or a triggered communications mode.

23. The apparatus of claim 17 wherein the processor is configured to transmit digital signals on the output pin.

24. The apparatus of claim 17 wherein the processor is configured to transmit analog signals on the output pin.

25. The apparatus of claim 17 further comprising an output pin coupled to the output node.

26. The apparatus of claim 17 wherein the processor is configured to communicate via a SENT protocol.

27. A system comprising
a magnetic target;
a magnetic field sensor comprising:
an output node;
a circuit to detect a magnetic field produced by the magnetic target; and
a processor circuit configured to:
transmit a signal representing the magnetic field onto the output node;
detect whether the transmitted signal is interrupted by an external source by sensing whether the output node is held at a low voltage by the external source; and
if the signal is interrupted, initiate a self-test of the apparatus.

28. The system of claim 27 wherein the processor is further configured to transmit a signal representing results of the self-test onto the output node.

29. The system of claim 27 wherein the processor is configured to communicate via a SENT protocol.

30. An apparatus comprising:
an output node;
a circuit to detect a magnetic field;
a processor circuit configured to:
transmit a signal representing the detected magnetic field onto the output node;
detect whether the transmitted signal is interrupted by an external source by sensing whether the output node is held at a low voltage by an external source;
if the signal is interrupted, initiate a self-test of the apparatus; and
transmit data representing test results onto the output node if results of the self-test indicate a failure.

31. An apparatus comprising:
an output node;
a circuit to detect a magnetic field;
a processor circuit configured to:
transmit a signal representing the detected magnetic field onto the output node;
detect whether the transmitted signal is interrupted by an external trigger signal;
if the signal is interrupted, initiate a self-test of the apparatus; and
transmit data representing test results onto the output node if results of the self-test indicate a failure.

* * * * *

UNITED STATES PATENT AND TRADEMARK OFFICE
CERTIFICATE OF CORRECTION

PATENT NO. : 9,739,846 B2
APPLICATION NO. : 14/506024
DATED : August 22, 2017
INVENTOR(S) : Craig Petrie et al.

Page 1 of 2

It is certified that error appears in the above-identified patent and that said Letters Patent is hereby corrected as shown below:

Column 4, Line 34, Column 8, Line 16, Column 10, Line 54, Column 13, Lines 12 and 29-30, delete all instances of "magnetic field sensor may" and replace with --magnetic field sensor 104 may--

Column 4, Line 64, Column 5, Lines 2-3, Column 5, Line 6, delete "magnetic field sensor 202" and replace with --magnetic field sensor 104--

Column 5, Line 23, delete "SMBUS" and replace with --SMBus--

Column 6, Lines 19-20, delete "may communication" and replace with --may communicate--

Column 6, Line 43, delete "if magnetic field sensor is" and replace with --if magnetic field sensor 104 is--

Column 7, Lines 1-2, delete "prevents communication line from" and replace with --prevents communication line 218 from--

Column 7, Lines 33-34, delete "driving communication line low" and replace with --driving communication line 218 low--

Column 7, Line 40, Column 10, Line 21, Column 10, Line 46, Column 12, Line 39, replace all instances of "magnetic field sensor 108" with --magnetic field sensor 104--

Column 7, Line 48, delete "duration the attempted" and replace with --duration of the attempted--

Column 8, Line 48, delete "indicate a passing results" and replace with --indicate passing results--

Column 9, Line 20, delete "field sensor is" and replace with --field sensor 104 is--

Column 9, Lines 39 and 46, delete both instance of "magnetic field sensor 108" and replace with --magnetic field sensor 104--

Signed and Sealed this
Tenth Day of July, 2018

Andrei Iancu
*Director of the United States Patent and Trademark Office*

CERTIFICATE OF CORRECTION (continued)
U.S. Pat. No. 9,739,846 B2

Column 10, Line 1, delete "line from" and replace with --line 218 from--

Column 10, Line 4, delete "line 212" and replace with --line 218--

Column 10, Lines 17-18, delete "line low" and replace with --line 218 low--

Column 10, Line 41, delete "combination pulses and time" and replace with --combination of pulses and time--

Column 10, Lines 55-56, insert --are included-- after "chains"

Column 10, Line 65, Column 11, Line 58, insert --104-- after "field sensor"

Column 12, Lines 16, and 19-20, Lines 32-33, insert --218-- after "line"

Column 12, Line 41, insert --of-- after "number"

Column 12, Line 35, delete "driving waveform" and replace with --driving. Waveform--

Column 13, Line 54, delete "results" and replace with --result--

Column 13, Lines 62-63, delete "600, can" and replace with --600 that can--

Column 14, Lines 21-22 and 26, delete "computational circuit may" and replace with --computational circuit 600 may--